United States Patent
Benjamin et al.

(10) Patent No.: US 10,469,036 B2
(45) Date of Patent: Nov. 5, 2019

(54) RECEIVER CALIBRATION USING POWER AMPLIFIER NOISE

(71) Applicant: INTEL IP CORPORATION, Santa Clara, CA (US)

(72) Inventors: Ofer Benjamin, Petach-Tikva (IL); Shahar Gross, Nes-Tziona (IL); Roy Amel, Haifa (IL)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/387,948

(22) Filed: Dec. 22, 2016

(65) Prior Publication Data

US 2018/0183390 A1    Jun. 28, 2018

(51) Int. Cl.
| H03F 1/32 | (2006.01) |
| H04B 1/16 | (2006.01) |
| H04B 1/04 | (2006.01) |
| H04B 1/40 | (2015.01) |
| H03F 3/19 | (2006.01) |
| H03G 3/30 | (2006.01) |
| H04B 1/525 | (2015.01) |

(52) U.S. Cl.
CPC ............... *H03F 1/32* (2013.01); *H03F 3/19* (2013.01); *H03G 3/3042* (2013.01); *H04B 1/04* (2013.01); *H04B 1/16* (2013.01); *H04B 1/40* (2013.01); *H04B 1/525* (2013.01); *H04B 2001/0408* (2013.01); *H04B 2001/0416* (2013.01)

(58) Field of Classification Search
CPC combination set(s) only.
See application file for complete search history.

(56) References Cited

U.S. PATENT DOCUMENTS

| 5,077,541 | A * | 12/1991 | Gilbert | H03G 1/0035 330/144 |
| 5,764,694 | A * | 6/1998 | Rahamim | H04B 3/46 370/289 |
| 2005/0137814 | A1* | 6/2005 | Kelly | G01R 29/26 702/69 |
| 2011/0043281 | A1* | 2/2011 | Golden | H03F 1/26 330/124 R |
| 2012/0140807 | A1* | 6/2012 | Chatterjee | H04B 1/0475 375/224 |
| 2012/0263256 | A1* | 10/2012 | Waheed | H04B 1/0475 375/296 |

* cited by examiner

*Primary Examiner* — Zhitong Chen
(74) *Attorney, Agent, or Firm* — Eschweiler & Potashnik, LLC

(57) ABSTRACT

Methods and systems for calibrating a receiver utilizing a noise signal generated by a power amplifier associated with a transmitter are provided. A calibration method or mode includes generating a noise signal with a power amplifier associated with a transmitter of the transceiver; processing the noise signal with the receiver to generate a received signal; and calibrating the receiver based at least on the received signal.

21 Claims, 2 Drawing Sheets

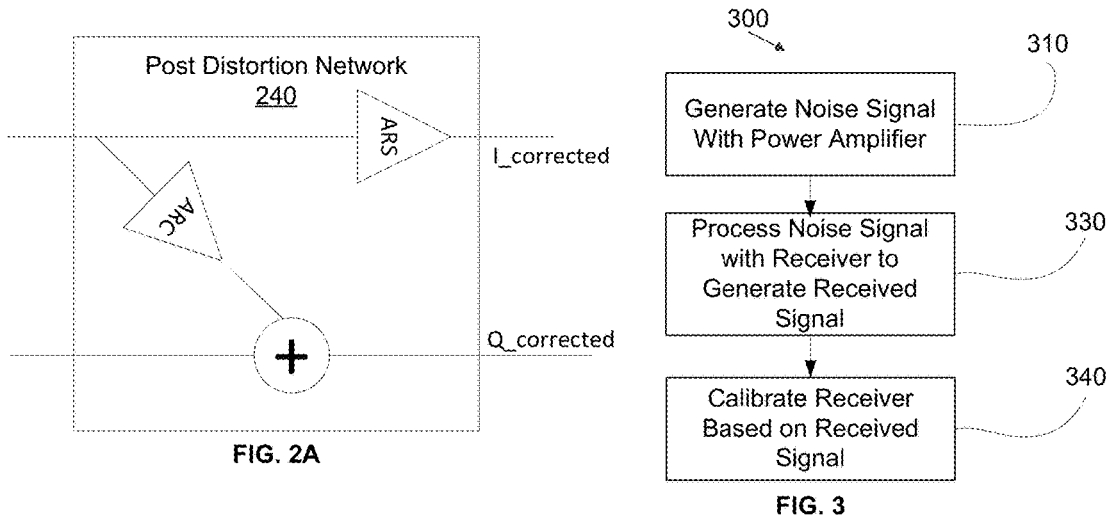
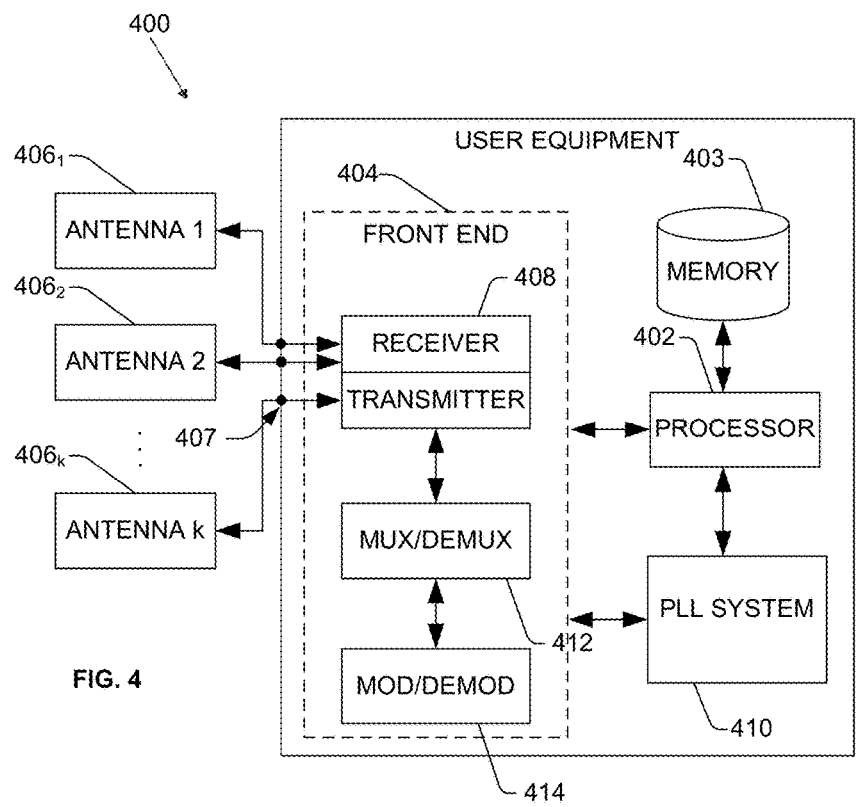

RECEIVER CALIBRATION USING POWER AMPLIFIER NOISE

FIELD

The present disclosure relates to the field of transceivers and in particular to calibration of wireless receivers.

BACKGROUND

Wireless transceivers are calibrated to mitigate and compensate for errors introduced by the electronic signal processing components in the transceivers. During calibration, a signal having some known properties is injected into the transceiver. Adjustments are made to components in the transceiver based on signals generated by the components in response to the calibration signal. In some instances, the signal is a "calibration signal" that has properties that make it similar to a signal that is processed by the transceiver during normal operation. In other instances, the signal is a "noise signal" that simulates white noise or some other type of noise.

One type of error experienced by quadrature transceivers is IQ mismatch. The quadrature receiver downconverts a quadrature baseband signal from a radio frequency (RF) signal to a quadrature baseband signal. More specifically, the receiver includes a mixer that mixes the RF signal with an in-phase component of a local oscillator signal to downconvert the radio frequency signal to an in-phase component (i.e., the "I" signal) of the quadrature baseband signal. The mixer also mixes the RF signal with a quadrature component of the local oscillator signal to downconvert the radio frequency signal to a quadrature component (i.e., the "Q" signal) of the quadrature baseband signal. The I signal and the Q signal are processed on separate paths of components within the receiver before being recombined for demodulation.

However, the gain of the components in the I path and the Q path may not match exactly. As a result, a gain error is introduced into the quadrature baseband signal. In addition, the in-phase component and the quadrature component of the local oscillator signal used by the mixer for downconversion may not be exactly ninety degrees out-of-phase. As a result, a phase error, or quadrature error, is introduced into the quadrature baseband signal. Combined, the gain and quadrature errors form an I/O mismatch error in the receiver. It is desirable to correct the I/O mismatch of the receiver in baseband in order to provide improved performance.

BRIEF DESCRIPTION OF THE DRAWINGS

Some examples of circuits, apparatuses and/or methods will be described in the following by way of example only. In this context, reference will be made to the accompanying Figures.

FIG. 2A illustrates one exemplary implementation of a post-distortion network.

FIG. 3 illustrates one exemplary implementation of a method of calibrating a receiver using self-noise generated by a transmitter power amplifier.

FIG. 4 illustrates an example device configured to calibrate a receiver using self-noise generated by a transmitter power amplifier, according to one exemplary implementation of the disclosure.

DETAILED DESCRIPTION

Using a noise signal to calibrate transceiver components increases the speed with which calibration may be performed as compared with using a calibration signal. This is because of the significant difference in the level of noise in the noise signal as compared to the level of noise introduced into a signal by transceiver components. Further, because a calibration signal is processed by transmitter components prior to being processed by receiver components during calibration, the errors introduced by the transmitter are separated from the errors introduced by the receiver in a separate step. In some calibration solutions, a noise signal used for calibration is generated by some dedicated "noise generator" component(s), which means additional components and cost.

In the near future mobile receivers will be required to support very high modulation schemes in MIMO (e.g. 1024QAM in the new IEEE 802.11ax standard). Hence the required total receiver SNR shall be targeted to 42 dB and above. In practice, most of the receiver's total SNR budget is kept for (integrated) phase-noise and baseband and analog to digital converter (ADC) SNR floors. The better receiver would be one that minimizes all other distortions, such as IQ mismatch, keeping them below 55 dBc. Currently the RX IQ mismatch floor is typically limited to less than 46 dBc, making it impossible to reach the total SNR figures mentioned above.

The described methods and systems utilize a transceiver's transmitter power amplifier to generate a noise signal for use in calibrating the transceiver's receiver. Mode control circuitry is configured to control the various transceiver components to operate in a calibration mode in which the power amplifier generates self-noise and the self-noise signal is provided to the receiver for use in calibrating the receiver. In this manner, a noise signal may be used to calibrate the receiver without the need for dedicated noise generation components, reducing cost while leveraging the benefits of using a noise signal to calibrate a receiver.

Figure 1:
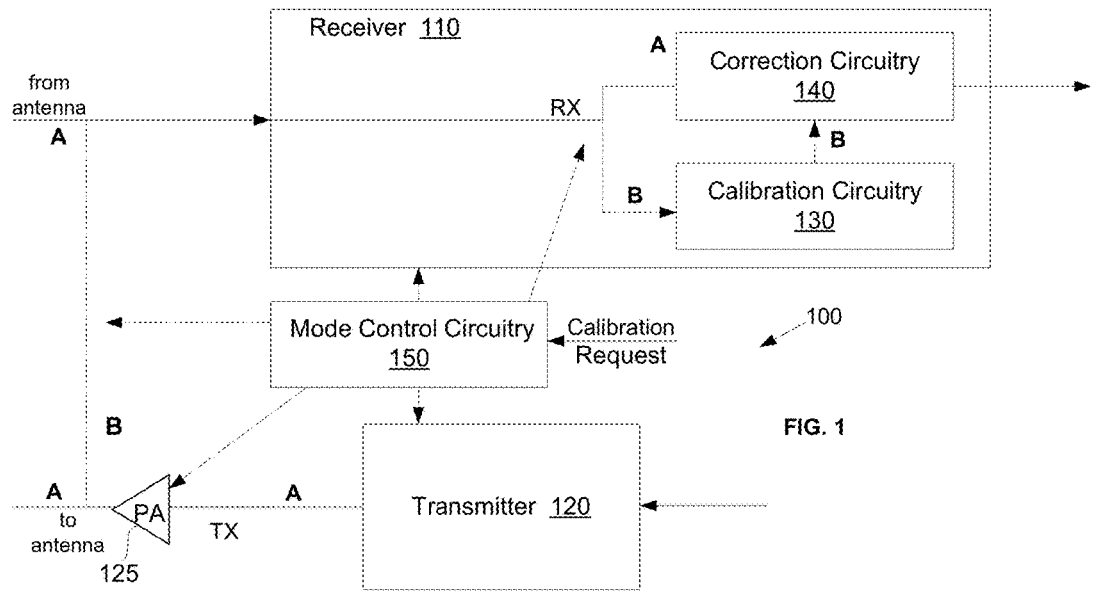
FIG. 1 illustrates a transceiver system that includes one exemplary implementation of mode control circuitry configured to calibrate the receiver using self-noise generated by a transmitter power amplifier.

FIG. 1 illustrates an exemplary implementation of a transceiver 100 that includes electronic signal processing components associated with a receiver 110 and electronic signal processing components associated with a transmitter 120. The transceiver 100 also includes mode control circuitry 150 that is configured to control various aspects of operation of the transceiver components to operate in several different transceiver modes. For example, the mode control circuitry 150 is capable of selectively enabling and disabling electronic components in the transceiver to place the transceiver in a selected mode. FIG. 1 illustrates the transceiver 100 being controlled by the mode control circuitry 150 to operate in a normal or non-calibration mode in which RF signals are being transmitted and received by the transceiver 100. In one exemplary implementation, mode control circuitry 150 is embodied as instructions in execution on a processor combined with hardware control logic. In one exemplary implementation, the control circuitry 150 is a radio controller that is capable of controlling various aspects of the transceiver.

A power amplifier 125 is in the normal (i.e., non-calibration) signal path A of the transmitter 120. The primary purpose of the power amplifier 125 is to amplify a transmit signal generated by the transmitter 120. To generate the transmit signal, which is indicated generally as TX in FIG. 1, the transmitter 120 modulates an RF carrier wave with a baseband signal that encodes information (e.g., symbols or tones) to be communicated by the transmit signal TX. The power amplifier 125 is a high gain linear amplifier that amplifies the transmit signal for transmission by an antenna (not shown). In some exemplary implementations, the power amplifier 125 is a series of amplifiers, however, for the purposes of this description, only a single power amplifier 125 will be described. The power amplifier 125 can be distinguished from other amplifiers in the transceiver circuitry by the fact that the power amplifier(s) 125 is disposed in the transmitter path between the transmitter 120 and the antenna. The power amplifier 125 does not process signals in the signal path of the receiver 110 during normal (i.e., non-calibration mode) operation of the transceiver.

During normal operation of the transceiver, as shown in FIG. 1, the receiver 110 processes signals on path A. The receiver 110 receives an RF signal from the antenna, demodulates the signal to a baseband signal, and converts the baseband signal from an analog signal to generate a digital "received signal" indicated generally in FIG. 1 as RX. The received signal is corrected in the digital domain by correction circuitry 140 that is configured to "post-distort" the received signal to compensate for various errors introduced in the received signal by transceiver components. The correction circuitry 140 includes electronic components, such as amplifiers and buffers or registers that can be adjusted to adjust the received signal to compensate for errors, such as "10 mismatch", as will be described in more detail with reference to FIG. 2A.

In response to a calibration request, the mode control circuitry 150 controls the transceiver 100 to operate in calibration mode. In one exemplary implementation, the calibration request is a signal generated during start up, at periodic intervals, upon detection of link quality degradation, upon detection of temperature drift, and/or at other times as appropriate by another transceiver component. When the transceiver 100 is in calibration mode, the mode control circuitry 150 controls various components of the transceiver 100 so that self-noise generated by the power amplifier 125 is input to the receiver 110 for use in calibrating the receiver. The electrical paths through which signals flow in calibration mode are shown in dashed line and are labeled B in FIG. 1. For the purposes of this description, self-noise is the noise signal generated by the power amplifier at a high gain setting in the absence of an input signal.

To place the transceiver 100 in calibration mode, the mode control circuitry controls the transmitter 120 in a manner such that the power amplifier is not receiving an input from the transmitter 120. In one exemplary implementation, the mode control circuitry 150 disables the transmitter 120 so that it is not generating a transmit signal TX. In one exemplary implementation, the mode control circuitry 150 opens an electrical path or connection between the transmitter 120 and the power amplifier 125. The mode control circuitry 150 controls the power amplifier 125 to increase the gain of the power amplifier to a maximum setting. In one exemplary implementation, the maximum gain setting is the absolute maximum gain setting which is the highest possible setting for the power amplifier 125. In one exemplary implementation, the maximum setting is a maximum setting that will result in power amplifier self-noise that is less than regulatory limits on noise generated by the transceiver 100. Other maximum gain settings which are lower than the absolute maximum gain setting of the power amplifier 125 may be used according to specific application.

The mode control circuitry 150 controls electronic components in the transceiver so that the self-noise generated by the power amplifier is provided to the receiver 110. In one exemplary implementation, the mode control circuitry 150 provides the self-noise to the receiver by activating a calibration amplifier (see FIG. 2) on an electrical path between the output of the power amplifier 125 and the receiver 110. The calibration amplifier amplifies the self-noise prior to the self-noise being input to the receiver 110. The mode control circuitry 150 controls the receiver 110 to process the self-noise signal as if the self-noise signal was received from the antenna to generate the digital baseband received signal RX. The mode control circuitry 150 controls transceiver components so that the received signal RX is provided to calibration circuitry 130. In one exemplary implementation, the mode control circuitry 150 enables or activates the calibration circuitry 130 during calibration mode and disables the calibration circuitry 130 during normal operation.

The calibration circuitry 130 is configured to determine or calculate error in the received signal and use the error to calibrate the transceiver 100. In the illustrated exemplary implementation, the calibration circuitry generates or calculates settings for the electronic components in the correction circuitry 140 that will compensate for the error by, for example, changing the phase and/or gain of the received signal. In other exemplary implementations, the self-noise signal is used by the calibration circuitry 130 to adjust the gain steps of a receiver amplifier (see FIG. 2) or other components. In general the self-noise signal can be used in the same manner as noise signals generated by dedicated components. The calibration circuitry 130 may include a processor or programmable gate array that executes an algorithm that generates correction circuitry settings based on the received signal. The settings are communicated to the correction circuitry 140 so that the electronic components of the correction circuitry are adjusted appropriately. In one exemplary implementation, the settings are stored in registers by the calibration circuitry 130. The operation of the correction circuitry 140 is controlled by the registers during normal transceiver operation. Because the transmitter is not operated during calibration mode, errors and impairments generated by transmitter components cannot affect the received signal, meaning that the receiver 110 is isolated during calibration and can be effectively calibrated.

Once the correction circuitry 140 has been adjusted according to the settings generated by the calibration circuitry 130, the mode control circuitry 150 controls the transceiver to begin operating in normal mode. In normal mode, the output of the power amplifier 125 is connected to the antenna and disconnected from the receiver 110. The transmitter 120 is enabled and the calibration circuitry 130 is disabled. The received signal generated by the receiver 110 is now post-distorted by the correction circuitry 140 to compensate for the error calculated during calibration using the self-noise of the power amplifier 125.

Figure 2:
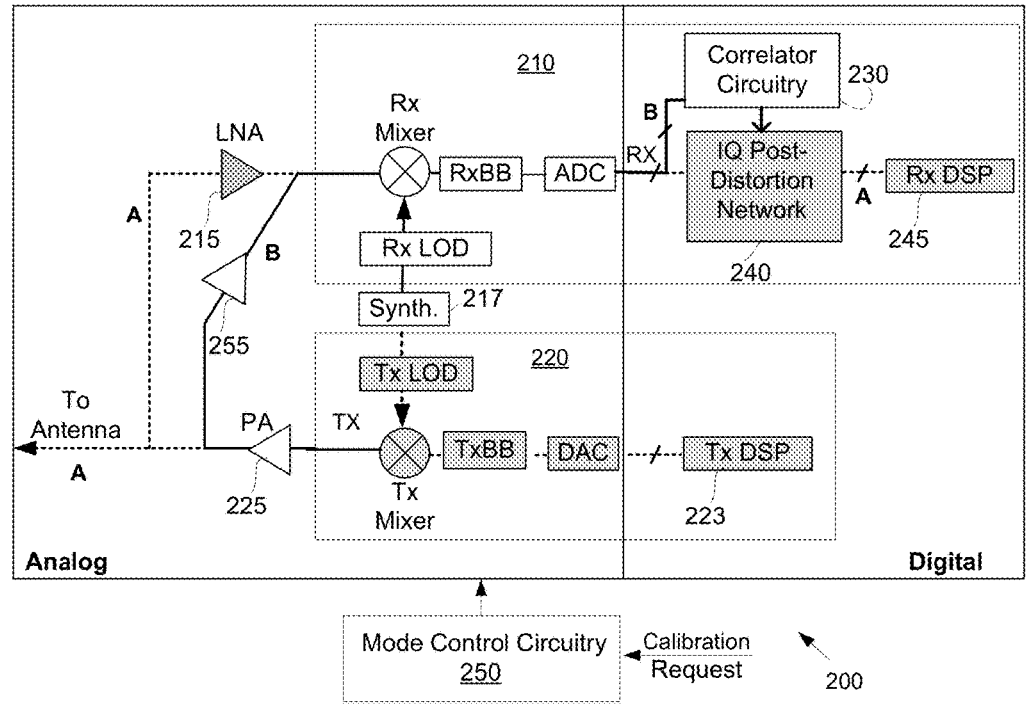
FIG. 2 illustrates one exemplary implementation of a transceiver system that includes mode control circuitry configured to calibrate the receiver using self-noise generated by a transmitter power amplifier.

FIG. 2 illustrates one particular exemplary implementation of a quadrature transceiver 200 that uses self-noise generated by a transmitter power amplifier 225 to calibrate a receiver 210 to compensate for IQ mismatch in the receiver's signal path. The transceiver 200 includes a receiver 210 and a transmitter 220 as well as mode control circuitry 250. The transmitter 220 includes digital signal processing (DSP) components that, during normal operation (path A dashed lines), convert information to be transmitted into a baseband signal. The transmitter 220 includes, in the analog domain, a digital to analog converter (DAC), transmitter baseband filters TX BB, TX local oscillator distribution circuitry TX LOD, and a TX mixer. During normal operation, the DAC converts the baseband single to an analog signal that is filtered by the baseband filters TX BB. The TX LOD distributes a local TX oscillator signal from a synthesizer 217 to the TX mixer. The TX mixer mixes the TX local oscillator signal with the filtered digital baseband signal to generate the transmit signal TX that is amplified by the power amplifier 225.

The receiver 210 includes, in the analog domain, an analog to digital converter (ADC), receiver baseband filters RX BB, an RX local oscillator RX LOD, and an RX mixer. During normal operation (path A dashed lines), a low noise amplifier (LNA) 215 amplifies an RF signal received from the antenna. The RX LOD distributes a local RX oscillator signal from the synthesizer 217 to the RX mixer. The RX mixer mixes the RX local oscillator signal with the amplified RF signal to generate an RX baseband signal. The RX baseband signal is filtered by RX filters RX BB and converted to a digital signal by the ADC to generate the received signal RX. In the digital domain, the receiver 210 includes correlator circuitry 230, IQ post-distortion network circuitry 240, and RX DSP components. The RX DSP components extract information from the received signal after the received signal has been corrected by the IQ post-distortion network 240.

Because the transceiver 200 is a quadrature transceiver, the transmitter and receiver each have two parallel signal processing paths: an I path on which the in-phase signal component flows and a Q path on which the quadrature signal component flows. Each signal path includes dedicated components, which are not shown in FIG. 2 for simplicity sake. For example, the receiver 210 includes two RX mixers, two RX local oscillators RX LOD, two RX baseband components RX BB, and two ADCs. As discussed above, due to mismatch between the components in the two receiver signal paths, error may be introduced into the received signal RX. The IQ post-distortion network circuitry 240 (similar to the correction circuitry 140 of FIG. 1) includes electronic components that adjust the I signal component and the Q signal component to compensate for the error caused by the IQ mismatch.

FIG. 2A illustrates one example of the post-distortion network 240 that includes two adjustable gain amplifiers ARC and ARS and a cross injection path that allows a portion of the I signal component to be injected into the Q signal component to compensate for IQ mismatch errors.

FIG. 2 illustrates the transceiver 200 operating in calibration mode (path B, solid lines). In order not to add any other transmitter impairments, such as TX IQ mismatch and spurs, the mode control circuitry 250 turns OFF TX associated components shown in grey. The transmitter components that are turned off include the DAC, TX BB, and TX LOD. The mode control circuitry 250 adjusts the gain of the power amplifier 255 to a preselected maximum setting. The self-noise of the power-amplifier output should not violate any regulatory limit. In one exemplary implementation, the maximal power amplifier noise level would roughly be −84 dBm/Hz, which is well (30 dB and more) below any known regulatory requirement and also leaving a decent margin for over process, temperature and voltage variations).

The mode control circuitry turns ON a loopback calibration amplifier 255 that amplifies the output of the power amplifier 225. The output of the calibration amplifier 255 is provided to the RX mixers. The LNA 215 may be turned OFF to prevent external blockers/jammers as well as spurs that are coupled to the LNA input from impacting the calibration. The calibration amplifier 225 should reflect the same output characteristics as the LNA 215 (such as impedance), in order to maintain the same working-point for the RX mixer, while the transceiver is in normal operation (non-calibration mode). In one exemplary implementation, the calibration amplifier 225 simply be another instantiation of the RX LNA 215.

The mode control circuitry 250 enables or turns ON the correlator circuitry 230. The correlator circuitry 230 samples the amplified self-noise in the ADC and the power difference. The power levels of I and Q, $1/N\Sigma I^2$ and $1/N\Sigma Q^2$ and their correlation values $1/N\Sigma IQ$ are estimated the correlator circuitry 230. The power difference and correlation are sufficient to compute settings for the electronic components in the IQ post-distortion network circuitry 240 to compensate the RX IQ mismatch. When the post-distortion network is like the network 240 of FIG. 2A, the gain settings for the amplifiers ARS and ARC can be computed according, in one exemplary implementation, to the following equations:

$$ARS = \frac{\frac{1}{N}\Sigma I^2}{\sqrt{\left(\frac{1}{N}\Sigma I^2\right)\left(\frac{1}{N}\Sigma Q^2\right) - \left(\frac{1}{N}\Sigma IQ\right)^2}} \qquad \text{EQ. 1}$$

$$ARC = \frac{\frac{1}{N}\Sigma IQ}{\sqrt{\left(\frac{1}{N}\Sigma I^2\right)\left(\frac{1}{N}\Sigma Q^2\right) - \left(\frac{1}{N}\Sigma IQ\right)^2}} \qquad \text{EQ. 2}$$

In order to validate the concept, an exemplary noise level planning was performed. The main target, is to have the self-generated noise 30 dB above the receiver BB+ADC noise, so it would be possible to estimate the RX IQ mismatch in a reasonable calibration time period. Table 1 shows a representative example, of noise level planning, based on a typical WiFi transceiver. It can be seen that the SNR (noise loading, which is equal to the ADC noise floor minus the noise at the ADC input) provided by using the PA output noise is 30 dB. This means that the calibration process can be performed in a relatively short time.

TABLE 1

| Noise Level Planning | |
|---|---|
| PA output noise | −144 dBm/Hz |
| PA coupler (attenuation) | −20 dB |
| Cal. Amp. input to ADC gain | 42 dB |
| Cal. Amp. + Rx Mixer noise figure | 6 dB |
| ADC FS | 11 dBm |
| ADC DR (over signal BW) | 78 dB |
| ADC noise floor (over signal BW) | −67 dBm |
| Noise at ADC input (over signal BW) | −37 dBm |
| Noise loading | 30 dB |
| Noise dBFS | 48 dB |

FIG. 3 illustrates one exemplary implementation of a method 300 configured to calibrate a receiver of a transceiver. The method 300 may be performed by a transceiver being controlled by mode control circuitry (150 in FIG. 1 and/or 250 in FIG. 2) to operate in a calibration mode. The method includes, at 310, generating a noise signal with a power amplifier associated with a transmitter of the transceiver. At 320, the noise signal is processed with the receiver to generate a received signal. At 330, the receiver is calibrated based at least on the received signal.

To provide further context for various aspects of the disclosed subject matter, FIG. 4 illustrates a block diagram of an exemplary implementation of wireless communication device 400 (e.g., smartphone, computer, cable modem or gateway, etc.) that can enable and/or exploit features or aspects of the disclosed aspects. The device 400 can be utilized with one or more aspects of the receiver calibration using transmitter power amplifier self-noise disclosed herein. The user device 400, for example, comprises a digital baseband processor 402 that can be coupled to a data store or memory 403, a front end 404 (e.g., an RF front end, an acoustic front end, or the other like front end) and a plurality of antenna ports 407 for connecting to a plurality of antennas $406_1$ to $406_K$ (K being a positive integer). The antennas $406_1$ to $406_K$ can receive and transmit signals to and from one or more wireless devices such as access points, access terminals, wireless ports, routers and so forth, which can operate within a radio access network or other communication network generated via a network device (not shown).

The device 400 can be a radio frequency (RF) device for communicating RF signals, an acoustic device for communicating acoustic signals, or any other signal communication device, such as a computer, a personal digital assistant, a mobile phone or smart phone, a tablet PC, a modem, a notebook, a router, a switch, a repeater, a PC, network device, base station or a like device that can operate to communicate with a network or other device according to one or more different communication protocols or standards.

The front end 404 can include a communication platform, which comprises electronic components and associated circuitry that provide for processing, manipulation or shaping of the received or transmitted signals via one or more receivers or transmitters (e.g. transceivers) 408, a mux/demux component 412, and a mod/demod component 414. The front end 404 is coupled to the digital baseband processor 402 and the set of antenna ports 407, in which the set of antennas $406_1$ to $406_K$ can be part of the front end. The front end 404 may be configured to perform receiver calibration using transmitter power amplifier self-noise. In one aspect, the user equipment device 400 can comprise a phase locked loop system 410.

The processor 402 can confer functionality, at least in part, to substantially any electronic component within the mobile communication device 400, in accordance with aspects of the disclosure. As an example, the processor 402 can be configured to execute, at least in part, executable instructions that cause the device to operation in a receiver calibration mode that uses power amplifier self-noise to calibrate the receiver. Thus the processor 402 may embody various aspects of the mode control circuitry of FIGS. 1 and 2, as a multi-mode operation chipset.

The processor 402 is functionally and/or communicatively coupled (e.g., through a memory bus) to memory 403 in order to store or retrieve information necessary to operate and confer functionality, at least in part, to communication platform or front end 404, the phase locked loop system 410 and substantially any other operational aspects of the phase locked loop system 410. The phase locked loop system 410 includes at least one oscillator (e.g., a VCO, DCO or the like) that can be calibrated via core voltage, a coarse tuning value, signal, word or selection process.

The processor 402 can operate to enable the mobile communication device 400 to process data (e.g., symbols, bits, or chips) for multiplexing/demultiplexing with the mux/demux component 412, or modulation/demodulation via the mod/demod component 414, such as implementing direct and inverse fast Fourier transforms, selection of modulation rates, selection of data packet formats, inter-packet times, etc. Memory 403 can store data structures (e.g., metadata), code structure(s) (e.g., modules, objects, classes, procedures, or the like) or instructions, network or device information such as policies and specifications, attachment protocols, code sequences for scrambling, spreading and pilot (e.g., reference signal(s)) transmission, frequency offsets, cell IDs, and other data for detecting and identifying various characteristics related to RF input signals, a power output or other signal components during power generation.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

The foregoing description of one or more implementations provides illustration and description, but is not intended to be exhaustive or to limit the scope of the example exemplary implementations to the precise form disclosed. Modifications and variations are possible in light of the above teachings or may be acquired from practice of various implementations of the exemplary implementations.

Example 1 is a method configured to calibrate a receiver of a transceiver that includes: generating a noise signal by a power amplifier operatively connected to a transmitter of the transceiver; controlling the receiver to process the noise signal to generate a received signal; and calibrating the receiver based at least on the received signal.

Example 2 includes the subject matter of example 1, including or omitting optional elements, wherein generating the noise signal includes adjusting a gain of the power amplifier to a maximum setting; and disconnecting the transmitter from the power amplifier, such that the noise signal is self-noise generated by the power amplifier when the transmitter is not connected to the power amplifier.

Example 3 includes the subject matter of example 1, including or omitting optional elements, further including amplifying the noise signal generated by the power amplifier prior to generating the received signal.

Example 4 includes the subject matter of examples 1-3, including or omitting optional elements, wherein the receiver is configured to generate an I component of the received signal and a Q component of the received signal, the method further including: comparing an aspect of the I component with a corresponding aspect of the Q component; and calibrating the receiver to compensate for mismatch between the I component and the Q component.

Example 5 includes the subject matter of example 4, including or omitting optional elements, wherein comparing an aspect of the I component with a corresponding aspect of the Q component includes comparing a power of the I component with a power of the Q component.

Example 6 includes the subject matter of examples 1-3, including or omitting optional elements, wherein calibrating the receiver includes adjusting electronic components in correction circuitry that is configured to post-distort the received signal during normal transceiver operation.

Example 7 includes the subject matter of examples 1-3, including or omitting optional elements, further including disabling transmitter components in the transceiver prior to controlling the power amplifier to generate the noise signal.

Example 8 includes the subject matter of examples 1-3, including or omitting optional elements, further including, after calibrating the receiver: enabling correction circuitry that post-distorts the received signal based at least on the calibration; disconnecting the power amplifier from the receiver; and amplifying a transmit signal generated by the transmitter with the power amplifier.

Example 9 is a calibration system configured to calibrate a receiver of a transceiver. The calibration system includes correction circuitry, mode control circuitry, and calibration circuitry. The correction circuitry includes electronic components configured to post-distort a received signal generated by the receiver. The mode control circuitry is configured to: control a power amplifier operatively connected to a transmitter of the transceiver to generate a noise signal; and control the receiver to process the noise signal to generate the received signal. The calibration circuitry is configured to measure an error in the received signal; and adjust one or more electronic components in the correction circuitry to reduce the error.

Example 10 includes the subject matter of example 9, including or omitting optional elements, wherein the mode control circuitry is configured to: adjust a gain of the power amplifier to a maximum setting; and disconnect the transmitter from the power amplifier, such that the noise signal is self-noise generated by the power amplifier in the absence of a signal from the transmitter.

Example 11 includes the subject matter of example 9, including or omitting optional elements, further including an intermediate amplifier configured to amplify the noise signal generated by the power amplifier.

Example 12 includes the subject matter of examples 9-11, including or omitting optional elements, wherein the receiver is configured to generate an I component of the received signal and a Q component of the received signal and wherein the calibration circuitry is configured to: compare an aspect of the I component with a corresponding aspect of the Q component; and adjust the one or more electronic components in the correction circuitry to compensate for mismatch between the I component and the Q component.

Example 13 includes the subject matter of example 12, including or omitting optional elements, wherein the calibration circuitry is configured to compare a power of the I component with a power of the Q component.

Example 14 includes the subject matter of examples 9-11, including or omitting optional elements, wherein the mode control circuitry is configured to disable transmitter components in the transceiver prior to controlling the power amplifier to generate the noise signal.

Example 15 includes the subject matter of examples 9-11, including or omitting optional elements, wherein the mode control circuitry is configured to, after adjusting the electronic components in the correction circuitry: enable correction circuitry that post-distorts the received signal based at least on the calibration; disconnect the power amplifier from the receiver; and enable transmitter components of the transceiver.

Example 16 is a transceiver that includes a transmitter, a receiver, calibration circuitry, and mode control circuitry. The transmitter includes a plurality of transmitter components configured to generate a transmit signal; and a power amplifier configured to amplify the transmit signal for transmission by an antenna. The receiver includes a plurality of receiver components configured to process a signal to generate a received signal; and correction circuitry configured to post-distort the received signal to compensate for errors in the received signal. The calibration circuitry is configured to: measure an error in the received signal; and adjust electronic components in the correction circuitry based on the measured error. The mode control circuitry is configured to, in response to a request to calibrate the receiver: control the power amplifier to generate the noise signal; and control the receiver to process the noise signal to generate the received signal.

Example 17 includes the subject matter of example 16, including or omitting optional elements, wherein the mode control circuitry is configured to: adjust a gain of the power amplifier to a maximum setting; and disconnect the transmitter from the power amplifier, such that the noise signal is self-noise generated by the power amplifier in the absence of a signal from the transmitter.

Example 18 includes the subject matter of examples 16-17, including or omitting optional elements, wherein the receiver is configured to generate an I component of the received signal and a Q component of the received signal and wherein the calibration circuitry is configured to: compare an aspect of the I component with a corresponding aspect of the Q component; and adjust the one or more electronic components in the correction circuitry to compensate for mismatch between the I component and the Q component.

Example 19 includes the subject matter of example 18, including or omitting optional elements, wherein the calibration circuitry is configured to compare a power of the I component with a power of the Q component.

Example 20 includes the subject matter of examples 16-17, including or omitting optional elements, wherein the mode control circuitry is configured to disable the plurality of transmitter components prior to controlling the power amplifier to generate the noise signal.

Example 21 is an apparatus, including means for generating a noise signal with a power amplifier associated with a transmitter of a transceiver; means for processing the noise signal with the receiver to generate a received signal; and means for calibrating the receiver based at least on the received signal.

Example 22 includes the subject matter of example 21, including or omitting optional elements, wherein the means for generating the noise signal comprises: means for adjusting a gain of the power amplifier to a maximum setting; and means for disconnecting the transmitter from the power amplifier, such that the noise signal is self-noise generated by the power amplifier in the absence of a signal from the transmitter.

Example 23 includes the subject matter of examples 21-22, including or omitting optional elements, further including means for amplifying the noise signal generated by the power amplifier.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated exemplary implementations of the subject disclosure, including what is described in the Abstract, is not intended to be exhaustive or to limit the disclosed exemplary implementations to the precise forms disclosed. While specific exemplary implementations and examples are described herein for illustrative purposes, various modifications are possible that are considered within the scope of such exemplary implementations and examples, as those skilled in the relevant art can recognize.

In this regard, while the disclosed subject matter has been described in connection with various exemplary implementations and corresponding Figures, where applicable, it is to be understood that other similar exemplary implementations can be used or modifications and additions can be made to the described exemplary implementations for performing the same, similar, alternative, or substitute function of the disclosed subject matter without deviating therefrom. Therefore, the disclosed subject matter should not be limited to any single exemplary implementation described herein, but rather should be construed in breadth and scope in accordance with the appended claims below.

In the present disclosure like reference numerals are used to refer to like elements throughout, and wherein the illustrated structures and devices are not necessarily drawn to scale. As utilized herein, terms "module", "component," "system," "circuit," "circuitry," "element," "slice," and the like are intended to refer to a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuitries can reside within a process, and circuitry can be localized on one computer and/or distributed between two or more computers. A set of elements or a set of other circuitry can be described herein, in which the term "set" can be interpreted as "one or more."

As another example, circuitry or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, circuitry can be an apparatus that provides specific functionality through electronic components without mechanical parts; the electronic components can include one or more processors therein to execute software and/or firmware that confer(s), at least in part, the functionality of the electronic components.

It will be understood that when an element is referred to as being "electrically connected" or "electrically coupled" or "operatively connected" to another element, it can be physically connected or coupled to the other element such that current and/or electromagnetic radiation can flow along a conductive path formed by the elements. Intervening conductive, inductive, or capacitive elements may be present between the element and the other element when the elements are described as being electrically coupled or connected to one another. Further, when electrically coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

Use of the word exemplary is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

What is claimed is:

1. A method configured to calibrate a receiver of a transceiver, the method comprising:
   controlling the transceiver to remove an input signal from a power amplifier to cause the power amplifier to generate a self-noise signal, wherein the power amplifier is operatively connected to a transmitter of the transceiver, further wherein the power amplifier is configured to receive the input signal from the transmitter and amplify the input signal for transmission by an antenna;
   controlling the receiver to process the self-noise signal to generate a received signal; and
   calibrating the receiver based at least on the received signal.

2. The method of claim 1, further comprising adjusting a gain of the power amplifier to a maximum setting.

3. The method of claim 1, comprising opening an electrical connection between the transmitter and the power amplifier to remove the input signal from the power amplifier.

4. The method of claim 1, wherein the receiver is configured to generate an I component of the received signal and a Q component of the received signal, the method further comprising:
   comparing an aspect of the I component with a corresponding aspect of the Q component; and
   calibrating the receiver to compensate for mismatch between the I component and the Q component.

5. The method of claim 4 wherein comparing an aspect of the I component with a corresponding aspect of the Q component comprises comparing a power of the I component with a power of the Q component.

6. The method of claim 1, wherein calibrating the receiver comprises adjusting electronic components in correction circuitry that are configured to post-distort the received signal during normal transceiver operation.

7. The method of claim 1 comprising disabling transmitter components in the transceiver to remove the input signal from the power amplifier.

8. The method of claim 1, further comprising, after calibrating the receiver:
  enabling correction circuitry that post-distorts the received signal based at least on the calibration;
  disconnecting the power amplifier from the receiver; and
  amplifying a transmit signal generated by the transmitter with the power amplifier.

9. A calibration system configured to calibrate a receiver of a transceiver, comprising:
  correction circuitry comprising electronic components configured to post-distort a received signal generated by the receiver;
  mode control circuitry configured to:
    control the transceiver to remove an input signal from a power amplifier configured to receive the input signal from a transmitter of the transceiver to cause the power amplifier to generate a self-noise signal, wherein the power amplifier is configured to amplify the input signal for transmission by an antenna; and
    control the receiver to process the self-noise signal to generate the received signal;
  calibration circuitry configured to:
    measure an error in the received signal; and
    adjust one or more electronic components in the correction circuitry to reduce the error.

10. The calibration system of claim 9, wherein the mode control circuitry is configured to adjust a gain of the power amplifier to a maximum setting.

11. The calibration system of claim 9, wherein the mode control circuitry is configured to open an electrical connection between the transmitter and the power amplifier to remove the input signal from the power amplifier.

12. The calibration system of claim 9, wherein the receiver is configured to generate an I component of the received signal and a Q component of the received signal and wherein the calibration circuitry is configured to:
  compare an aspect of the I component with a corresponding aspect of the Q component; and
  adjust the one or more electronic components in the correction circuitry to compensate for mismatch between the I component and the Q component.

13. The calibration system of claim 12, wherein the calibration circuitry is configured to compare a power of the I component with a power of the Q component.

14. The calibration system of claim 9, wherein the mode control circuitry is configured to disable transmitter components in the transceiver to remove the input signal from the power amplifier.

15. The calibration system of claim 9, wherein the mode control circuitry is configured to, after adjusting the electronic components in the correction circuitry:
  enable correction circuitry that post-distorts the received signal based at least on the calibration;
  disconnect the power amplifier from the receiver; and
  enable transmitter components of the transceiver.

16. A transceiver, comprising:
  a transmitter comprising:
    a plurality of transmitter components configured to generate a transmit signal; and
    a power amplifier configured to receive the transmit signal from the transmitter components and amplify the transmit signal for transmission by an antenna;
  a receiver comprising:
    a plurality of receiver components configured to process a signal to generate a received signal; and
    correction circuitry configured to post-distort the received signal to compensate for errors in the received signal;
  calibration circuitry configured to:
    measure an error in the received signal; and
    adjust electronic components in the correction circuitry based on the measured error; and
  mode control circuitry configured to, in response to a request to calibrate the receiver:
    control the transceiver to remove the transmit signal from the power amplifier to cause the power amplifier to generate a self-noise signal; and
    control the receiver to process the self-noise signal to generate the received signal.

17. The transceiver of claim 16, wherein the mode control circuitry is configured to disconnect the transmitter from the power amplifier.

18. The transceiver of claim 16, wherein the receiver is configured to generate an I component of the received signal and a Q component of the received signal and wherein the calibration circuitry is configured to:
  compare an aspect of the I component with a corresponding aspect of the Q component; and
  adjust one or more of the electronic components in the correction circuitry to compensate for mismatch between the I component and the Q component.

19. The transceiver of claim 18, wherein the calibration circuitry is configured to compare a power of the I component with a power of the Q component.

20. The transceiver of claim 16, wherein the mode control circuitry is configured to disable the plurality of transmitter components to remove the transmit signal from the power amplifier.

21. The transceiver of claim 16, wherein the mode control circuitry is configured to open an electrical connection between the transmitter components and the power amplifier to remove the transmit signal from the power amplifier.

* * * * *